United States Patent [19]

Fassino et al.

[11] Patent Number: 5,155,397

[45] Date of Patent: Oct. 13, 1992

[54] C-MOS DIFFERENTIAL SENSE AMPLIFIER

[75] Inventors: Mario Fassino; Mario Sartori, both of Torino, Italy

[73] Assignee: Cselt - Centro Studi E Laboratori Telecomunicazioni S.P.A., Torino, Italy

[21] Appl. No.: 630,277

[22] Filed: Dec. 19, 1990

[30] Foreign Application Priority Data

Dec. 22, 1989 [IT] Italy .................... 68155 A/89

[51] Int. Cl.⁵ .................................. G11C 7/00
[52] U.S. Cl. ........................... 307/530; 365/208
[58] Field of Search ............... 307/530; 365/207, 208

[56] References Cited

U.S. PATENT DOCUMENTS

| | | | |
|---|---|---|---|
| 4,027,176 | 5/1977 | Heuber et al. | 365/208 X |
| 4,727,519 | 2/1988 | Morton et al. | 365/233 |
| 4,823,031 | 4/1989 | Kadakia | 307/530 |

FOREIGN PATENT DOCUMENTS 0085767 7/1988 European Pat. Off. .

Primary Examiner—James B. Mullins
Attorney, Agent, or Firm—Herbert Dubno

[57] ABSTRACT

A C-MOS sense amplifier capable of detecting voltage differences between the signals applied to its inputs in correspondence with the clock signal transitions. The amplifier has a level converter, a sense circuit and a feedback block which are inactive in a first inactive phase of the clock signal, while in a second active phase, immediately after clock signal transition, the sense amplifier attains the operating point necessary to activate the level converter and the sense circuit. Hence a high positive feedback is started which switches the sense circuit. Finally, after the level transition of a delayed clock signal, the feedback signal generated by the feedback block reduces to zero the dissipation of the whole differential sense amplifier.

9 Claims, 3 Drawing Sheets

5,155,397

C-MOS DIFFERENTIAL SENSE AMPLIFIER

FIELD OF THE INVENTION

The present invention relates to digital electronic circuits and more particularly, to a C-MOS differential sense amplifier.

BACKGROUND OF THE INVENTION

As known, a sense amplifier is a circuit sensitive to small voltage differences between the signals applied to its two inputs, as function of which it supplies at its two outputs a high-level logic signal, corresponding to the higher voltage input, and a low-level logic signal, corresponding to the other input, or vice versa.

The amplifier power dissipation is both dynamic, in correspondence with the signal transitions, and static during the whole operating time, even though it is implemented in C-MOS technology. Circuits of this type are generally used in static RAM and ROM memories to restore the data stored in differential mode with a small voltage difference between the logic levels. Generally a differential sense amplifier per each bit outgoing from the memory is used; that is why if the datum consists of a rather high number of parallel bits (higher than 16 or 32), the static power dissipation of the set of said circuits becomes considerable.

Presently different types of differential sense amplifiers are known which basically differ from each other in the operation mode. A first kind of differential sense amplifier presents a continuous-time operation, i.e. the circuit is sensitive to all input signal variations, whenever they take place. Hence the sense amplifier presents continuous-time static and dynamic dissipation. Another kind operates in a clocked mode, that is why it is sensitive to all input signal variations which take place during the active phase of clock signal. As a consequence it has a static and dynamic power dissipation only during this phase. Differential feedback sense amplifiers of the latter type exist, which are sensitive to voltage differences between input signals only in correspondence with clock signal transitions, and hence are no longer affected by the successive voltage variations which can take place during the active phase of clock signal. A practical application of such circuits is shown in FIG. 1 of the article entitled "A 9ns 1Mb CMOS SRAM" by K. Sasaki et alii, ISSCC 89 Conference Proceedings, Feb. 15, 1989, San Diego, CA. These differential sense amplifiers have dynamic power dissipation during the transition and a static dissipation for the remaining active phase. Besides the circuits examined show satisfactory operation when the input signals have common mode voltages lower than about ⅔ of the supply voltage.

OBJECT OF THE INVENTION

It is an object of the invention to overcome these disadvantages with an improved differential sense amplifier with clock signal transitions and can operate with input signals with common-mode voltages close both to supply voltage, and to ground so that this circuit can also be used in RAMs, where the data are generally stored with rather high common-mode voltages.

The present invention provides a C-MOS differential sense amplifier adapted to detect voltage differences between the signals applied to its inputs in correspondence with the level transition of a clock signal. The sense amplifier of the invention comprises a level converter which receives at its input terminals the signals to be sensed and is able to lower the common mode voltage of the signals without attenuating their voltage difference under the control of clock signals and of signals generated by a feedback unit. A sense circuit receives at its first and second input terminals the signals supplied by the level converter and transfers to a first and to a second outputs the voltage difference present at the inputs, enormously amplified thanks to a highly positive feedback under the control of clock signals.

The feedback unit receives at its input terminals the signals at the outputs of the sense circuit and generates a feedback signal. In a first inactive phase of the clock signal the level converter, the sense circuit and the feedback unit are inactive and in a second active phase of the clock signal, immediately after the clock signal transition, the differential sense amplifier reaches the operating point necessary to render the level converter and the sense circuit active. Hence the high positive feedback is started which switches the sense circuit and, finally, after the level transition of the delayed clock signal, the feedback signal generated by the feedback unit reduces to zero the dissipation of the whole differential sense amplifier.

The lever converter has its input terminals connected to the gate terminals of first and second n-channel MOSFETs which have their source terminals connected together and to the drain of a third n-channel MOSFET whose source is grounded and whose gate is connected to a first wire which can be connected from the outside, a fourth and a fifth p-channel MOSFETs having their source terminals connected to a supply source, the drain terminals connected to the respective drain terminals of the first and second MOSFETs which can be contacted from the outside and the gate terminals connected together and to the output of the feedback unit, which is also connected to the drain of a sixth n-channel MOSFET, whose gate can be contacted from the outside through a second wire and whose source is grounded.

In the level converter, a seventeenth and an eighteenth p-channel diode-connected MOSFETs are placed in series with the drains of the fourth and fifth p-channel MOSFETs.

The feedback unit can consist of a seventh and an eighth channel MOSFETs, whose drain terminals are connected together and to the output of the feedback unit. The seventh MOSFET has its source connected to the first output of the sense circuit and the gate connected to the second output thereof, while the eighth MOSFET has the source connected to the second output and the gate connected to the first output.

The level converter, alternatively, has its input terminals connected to the gate terminals of the first and a second n-channel MOSFETs which have the source terminals connected to each other and to the drain of a third n-channel MOSFET, whose source is grounded and whose gate is connected to the first wire which can be contacted from the outside. A ninth and a tenth p-channel have their source terminals connected to the supply source, the drain terminals connected to the respective drain terminals of the first and second MOSFETs, which can be contacted from the outside and the gate terminals connected to each other and to the outside through the first wire.

The feedback block or unit can comprise an eleventh and a twelfth n-channel MOSFETs. The eleventh MOSFET has the source connected to the first input terminal, the drain connected to the first output and the gate connected to the second output, while the twelfth MOSFET has the source connected to the second input terminal, the drain connected to the second output and the gate connected to the first output.

The sense circuit can comprise a thirteenth p-channel MOSFET, which as the drain and the source connected to the output wires and the gate connected to a third wire to be contacted from the outside.

The clock signal is present on the first wire, an inverted clock signal is present on the second wire and the delayed clock signal is present on the third wire.

BRIEF DESCRIPTION OF THE DRAWING

The foregoing and other characteristics of the present invention will become clearer from the following description, reference being made to the the annexed drawing in which.

SPECIFIC DESCRIPTION

The C-MOS differential sense amplifier, described herewith, is a feedback and clocked circuit. As a consequence, it detects the voltage difference at its inputs only in correspondence with the level transition of the clock signal, received separately from input signals, and remains insensitive for the remaining duration of the clock signal active phase.

Figure 1:
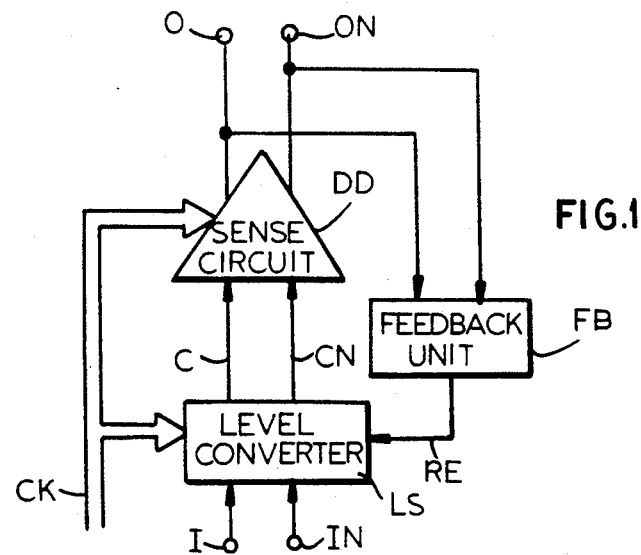
FIG. 1 is a general block diagram of the differential sense amplifier.

In the block diagram of FIG. 1, the input signals are applied to the terminals I and IN, connected to a level converting block LS. This block is to lower input signal common-mode voltage, without affecting the voltage difference between the signals themselves. It is a differential voltage divider whose operation is controlled both by a clock signal present on connection CK, and by a signal coming on a wire RE from feedback block or unit FB, so that under static conditions LS consumes no power.

Various clock signals can be present on connection CK. More particularly, these can include a clock signal, its inverted clock signal and a slightly delayed clock signal.

The signals converted to lower voltage level, available on wires C and CN outgoing from block LS, are sent to the inputs of a sense circuit DD. This is a high-gain feedback amplifier, wherein the voltage difference at the inputs is transferred to the outputs O and ON enormously amplified thanks to the high positive feedback between inputs and outputs. As a consequence circuit DD passes rapidly to one of the two stable saturation conditions and does not go out until the successive active phase determined by the clock signal on connection CK. Signals at the outputs O and ON are also transferred to a block FB, which generates a feedback signal on wire RE to reduce to zero the differential sense amplifier dissipation under static conditions.

Figure 2:
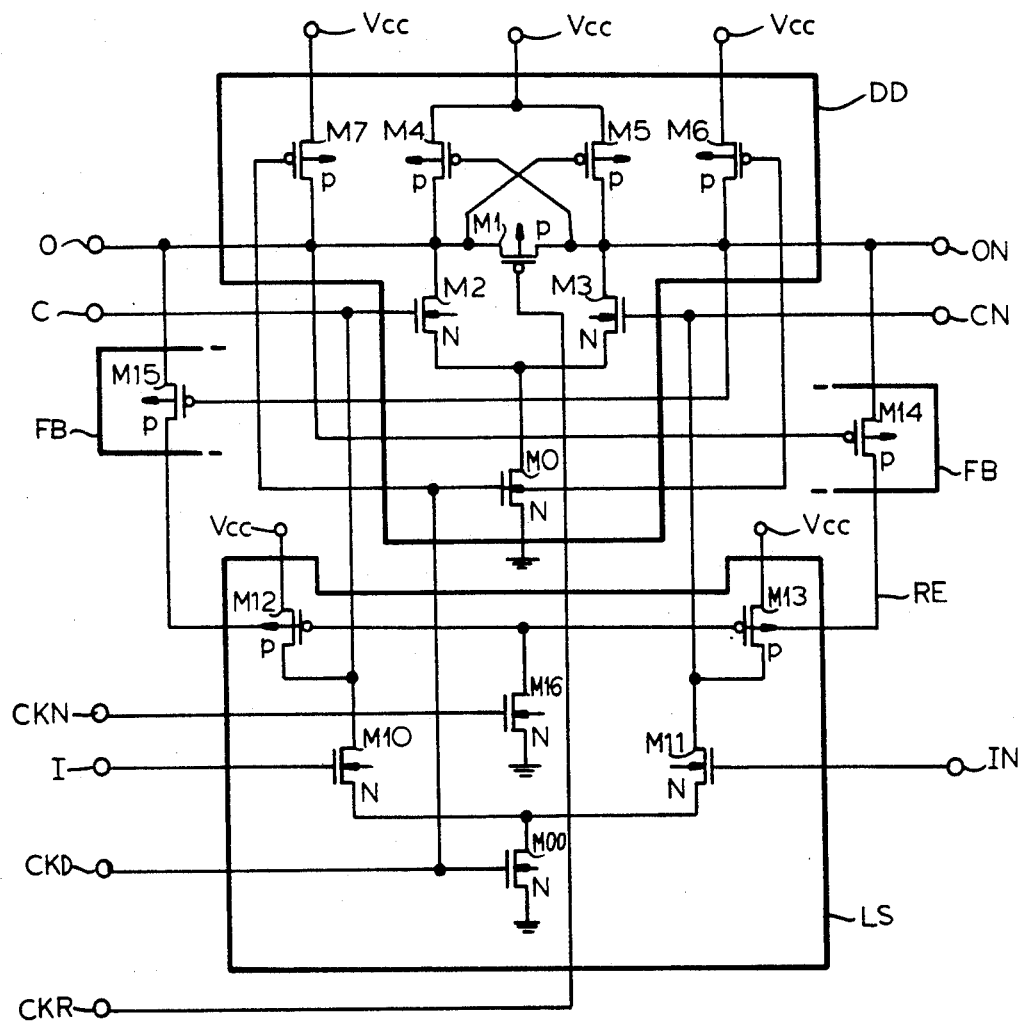
FIG. 2 is a circuit diagram of a first embodiment; the electrical scheme of a first way of embodiment.

FIG. 2 is a circuit diagram of a first embodiment of the differential sense amplifier.

Level converting block LS receives the input signals on wires I and IN, connected to the gate terminals of two n-channel MOSFETs M10 and M11, whose source terminals are interconnected so as to form a differential amplifier. M10 and M11 sources are connected to the drain of an n-channel MOSFET M00, which acts as a current source. M00 has the source connected to the ground and the gate connected to a wire CKD, which can be contacted from the outside, whereupon the clock signal arrives.

Two p-channel MOSFETs M12 and M13 allow the feedback current to flow in the two branches of the differential amplifier, having the source terminals connected to the supply source Vcc and the drain terminals to the respective drain terminals of M10 and M11, which can be contacted from the outside through wires C and CN. The gate terminals of M12 and M13 are connected to each other and to the feedback block FB by wire RE. The node, wherein wire RE and M12 and M13 gate terminals are conveyed, is precharged at the ground potential by an n-channel MOSFET M16, whose gate can be contacted from the outside through wire CKN, whereupon a clock signal inverted with respect to the one present on wire CKD arrives. M16 source terminal is grounded and the drain terminal is connected to wire RE.

To make the circuit of FIG. 2 more clear feedback block FB is shown as subdivided into two parts. It is composed of two n-channel MOSFETs M15 and M14, the drain terminals of which are connected to each other and to wire RE and each MOSFET has the source connected to a wire outgoing from the amplifier and the gate connected to the other output wire. More particularly, M15 has the source connected to wire O and the gate connected to wire ON, while M14 has the source connected to wire ON and the gate connected to wire O.

Sense circuit DD receives from the level converting block LS the input signals on wires C and CN, which are connected to the gate terminals of two n-channel MOSFETs M2 and M3. The latter MOSFETs have the source terminals to the drain of an n-channel MOSFET M0, which operates as a current source. M0 has the source connected to ground and the gate connected to wire CKD, which can be contacted from the outside, whereupon it receives the clock signal.

Two MOSFETs M2 and M3 have drain terminals connected to outputs O and ON of the differential sense amplifier, as well as to the drain terminals of two p-channel MOSFETs M4 and M5. The latter MOSFETs, having the source terminals connected to supply source Vcc, allow the supply current flow through MOSFETs M2 and M3. Besides, since their drain terminal is connected to a wire outgoing from the amplifier and the gate terminal connected to the other output wire, M4 and M5 allow a positive feedback to take place. More particularly, M4 has the drain connected to wire O and the gate connected to wire ON, while M5 has the drain connected to wire ON and the gate connected to wire O.

A p-channel MOSFET M1 has drain and source terminals connected to output wires O and ON, so as to short-circuit them in correspondence with the active phase of the delayed clock signal it receives on the gate through wire CKR.

Finally, the nodes connected to output wires O and ON are precharged at supply voltage Vcc by two p-channel MOSFETs M7 and M6, whose source terminals are connected to supply source Vcc, drain terminals are connected to output wires O and ON and gate terminals are connected to wire CKD, whereupon the clock signal is present.

In the operation of the differential sense amplifier two clocked phases can be distinguished: the first is a precharge phase with clock signal at low logic level and the second is an amplification phase with clock signal at high logic level.

The signal at the input I is in phase with the signal at the output O, and hence the signal at the input IN is in phase with the signal at the output ON.

During the precharge phase, since the signal on wire CKD is at low logic level, MOSFETs M00 and M0 are cut off, in MOSFETs M10, M11 and M2, M3 there is no current flow, hence blocks LS and DD are inactivated.

MOSFETs M7 and M6 begin to conduct by precharging to Vcc the two outputs O and ON, which thus inactivate block FB since the gates and sources of conduct, since it is controlled by the inverted clock signal on wire CKN, precharging to ground the node connected to wire RE at the output of feedback block FB; to the same node there are connected to gates of MOSFETs M12 and M13, which begin to conduct raising to Vcc the inputs C and CN of block DD; MOSFET M1 begins to conduct since it is controlled by the delayed clock signal, which after a short delay, is in phase with the clock signal on wire CKD.

It is to be noted that block DD has both inputs and outputs at the same potential Vcc, and hence it starts from a steady state before, in the next phase, its positive feedback is started. This steady state is essential in order to avoid faulty detections of the input signals. MOSFET M1 responds to this situation even after the precharge phase is over for the whole delay between the clock signal and the same delayed signal. Thus it is possible to face the small circuitry differences of technological kind and the setting time of the circuit, necessary to pass from one operation phase to the other.

During this phase the input signal does not affect the outputs. Current dissipation is dynamic and lasts only for the time necessary to precharge the nodes, then it goes to zero. The supply current peak is the maximum occurring during the whole circuit operation.

In the amplifying phase three successive operating periods can be distinguished:

at the instant immediately successive to the clock signal transition, the circuit reaches the operating point necessary to become active:

then the positive feedback which causes circuit switching is started;

once the switching has taken place a feedback signal is generated which reduces to zero the circuit dissipation.

In the first period, all precharge MOSFETs M16, M7 and M6 are cut off, MOSFETs M00 and M0 begin to conduct, hence the blocks DD and LS become active, and the circuit begins to draw current. Block FB remains inactive, since MOSFET M1, controlled by the delayed clock signal, still remains in conduction.

In the second period, circuit LS brings to steady state the potential at inputs C and CN of block DD, which begins to umbalance the outputs still remaining hindered by M1. As soon as the delayed clock signal passes to high logic level, the positive feedback abruptly drives the outputs into umbalance: one remains at Vcc, the other goes to ground potential. This voltage difference causes one of the two MOSFETs M14, M15, forming block FB, to conduct.

During this operation period, supply current reaches the maximum value which takes place during the whole amplification phase.

In the third period, through the source of one of the two MOSFETs of block FB, which begins to conduct, the node connected to wire RE passes from the ground potential to Vcc, thus cutting off the two MOSFET M12 and M13 of block LS.

As the supply current is interrupted, the two outputs C and CN of block LS, and hence the inputs of block DD, reach the ground potential through MOSFETs M00, M10, M11. As a consequence, in block DD the two MOSFETs M2 and M3 are cut off, by interrupting the current in the two respective circuit branches without modifying the output potential. At the end of this operating period the current dissipation goes again to zero and the output datum remains valid till the amplification phase end.

During the amplification phase the input signal is to remain constant till the circuit enters the third period.

Figure 3:
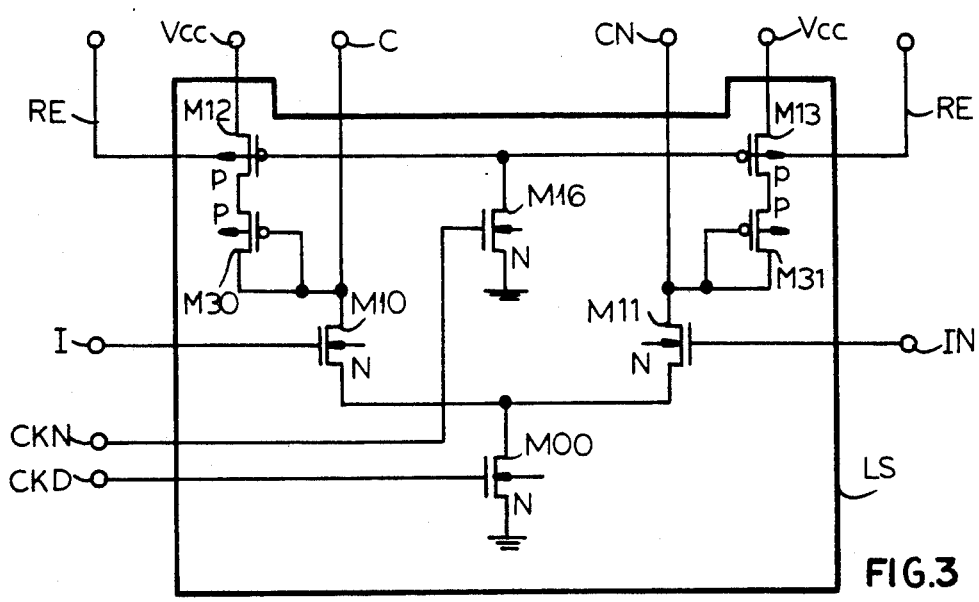
FIG. 3 is a circuit diagram of an alternative embodiment of the block denoted by LS in FIG. 2.

FIG. 3 is a drawing of a variant of the block denoted by LS in FIG. 2.

The difference with respect to the preceding scheme consists in the presence of two p-channel diode-connected MOSFETs M30 and M31, placed in series with the drains of M12 and M13. Thanks to this addition, the differential sense amplifier can easily operate with low common mode voltages at the input, e.g. lower than a third of the supply voltage.

Figure 4:
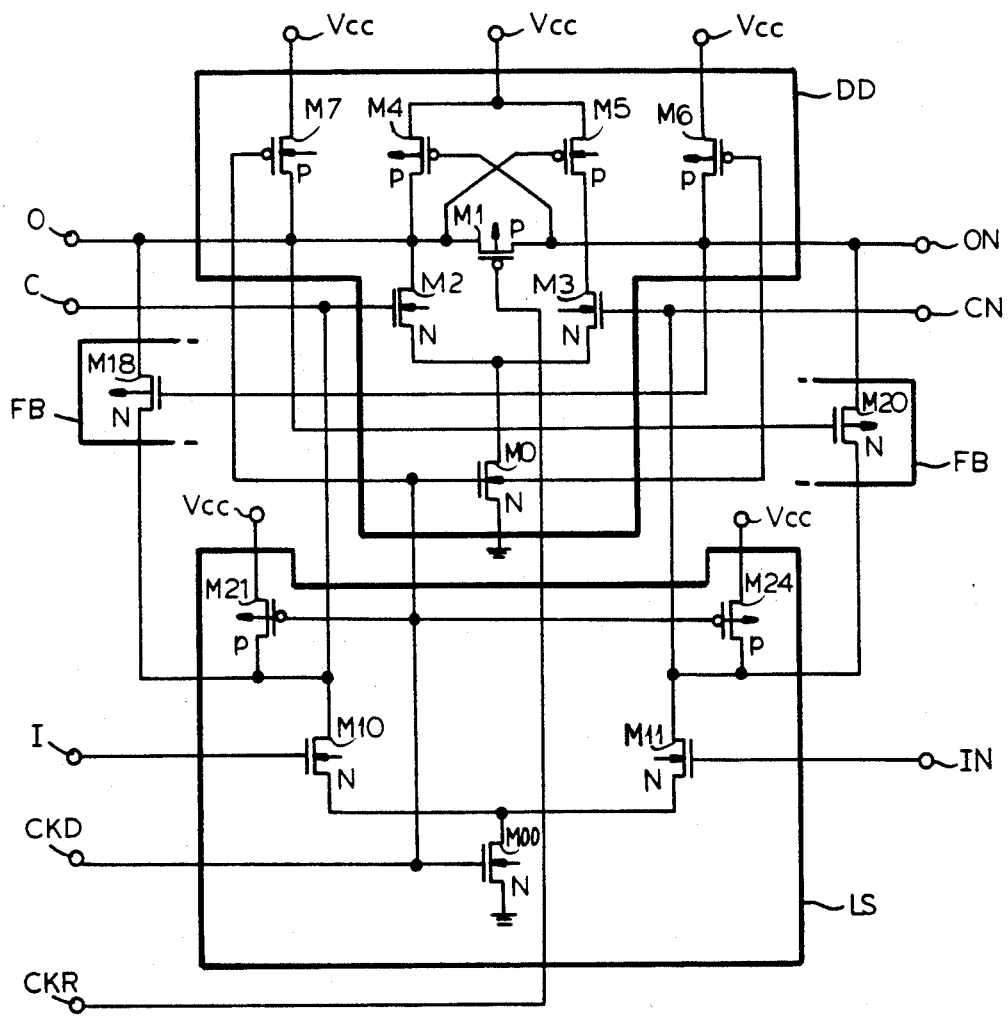
FIG. 4 is a circuit diagram of a second embodiment; and the the electrical scheme of a second way of embodiment.

FIG. 4 shows another example of embodiment of a C-MOS differential sense amplifier.

It is to be noted that the number of MOSFETs and of the interconnections is reduced and the inverted clock signal is unnecessary.

Block DD is equal to the one of the preceding example, while blocks FB and LS present some variants. As far as possible, in this Figure the same notations as in the preceding Figure have been maintained.

The converting block LS receives the input signals on wires I and IN, connected to the gate terminals of two n-channel MOSFETs M10 and M11, which have the source terminals connected together so as to form a differential amplifier. M10 and M11 sources are connected to the drain of n-channel MOSFET M00, which operates as a current source. M00 has its source connected to ground and its gate connected to wire CKD, which can be contacted from the outside, whereupon the clock signal arrives.

Two p-channel MOSFETs M21 and M24 precharge to supply voltage Vcc LS outputs C and CN, having the source terminals connected to the supply source Vcc and the drain terminals connected to the respective drain terminals of M10 and M11, which can be contacted from the outside through wires C and CN. The gate terminals of M21 and M24 are connected together and to wire CKD.

Feedback block FB, still shown as subdivided into two parts to make more clear the scheme, consists of two n-channel MOSFETs M18 and M20. Each MOSFET has the source connected to an input wire of block DD, the drain connected to an output wire of block DD and the gate connected to the other output wire.

More particularly, M18 has the source connected to wire C, the drain connected to wire O and the gate connected to wire ON, while M20 has the source connected to wire CN, the drain connected to wire ON and the gate connected to wire O.

In the operation of the differential sense amplifier, two phases determined by the clock signal present on wire CKD can be distinguished: the first is a precharge phase with the clock signal at low logic level and the second is an amplifying phase with the clock signal at high logic level.

The signal at input I is in phase with the output signal O, and hence the signal at input IN is in phase with the signal at output ON.

In the first phase the circuit is in the following state: MOSFETs M00 and M0 are cut off, hence blocks LS and DD are inactive; MOSFETs M7 and M6 begin to conduct by precharging to Vcc the two outputs O and ON; MOSFETs M21 and M24 begin to conduct by precharging to Vcc the inputs C and CN of block DD, then MOSFETs M18 and M20 have all the terminals at supply voltage Vcc; MOSFET M1 is conducting since the clock signal on wire CKR is at low logic level, like the signal on wire CKD, till and beyond CKD transition.

It is to be noted that block DD has both the inputs and the outputs at the same potential and hence it starts from a steady state before, during the successive phase, its positive feedback starts. This steady state is essential to avoid faulty detections of the input signals.

In the amplification phase as well, three successive operation phases can be distinguished, as in the previous case.

During the first period, all the precharge MOSFETs M7, M6, M21 and M24 are cut off; MOSFETs M0 and M00 being to conduct, then blocks DD and LS become active and the circuit begins to draw current; block FB remains in the condition reached in the precharge phase; MOSFET M1 remains still in conduction.

During the second period, circuit LS brings to steady state the potential at the inputs of block DD which starts to umbalance the outputs, still remaininining hindered by M1. As soon as the clock signal on wire CKR passes to high logic level, the positive feedback abruptly drives the two outputs into umbalance: one stays at Vcc, the other reaches ground potential. This voltage difference cuts offone of the two MOSFETs M18 and M20 which form block FB. Said two MOSFETs beside eliminating the circuit dissipation have also another function: let us assume that the output O reaches Vcc and output ON the ground potential.

MOSFET M18 is cut off and hence output C discharges to ground through M10 and M00; MOSFET M20 remains in conduction, hence in addition to output CN also output ON, which has to be at ground potential, discharges to ground.

That is why a path which forces to ground the output remains active, eliminating a low residual voltage of some hundreds of millivolts: hence the outputs are not at high impedance.

In the third period, as the inputs of block DD are brought to ground potential, the two MOSFETs M2 and M3 are cut off and the current in the two respective branches of the circuit is interrupted without modifying the output potential.

At the end of this operation period, the current dissipation reduces to zero and the output datum remains valid till the end of the amplification phase.

Figure 5:
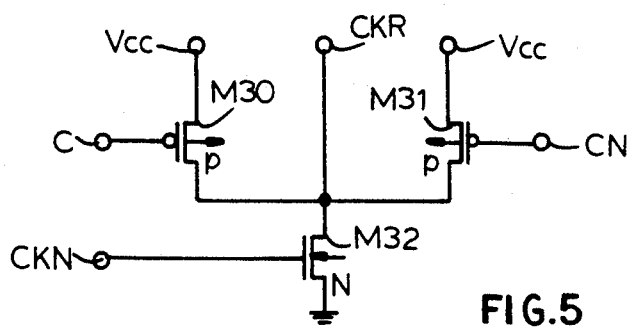
FIG. 5 is a circuit diagram of a delay circuit.

FIG. 5 is a diagram of a delay circuit which allows the internal generation of the delayed clock signal.

By this circuit, a twofold advantage can thus be obtained: first of all a clock signal is saved and then the delay is not fixed, but it follows the circuit clocking.

The inverted clock signal present on wire CKN arrives at the gate terminal of an n-channel MOSFET M32, which has the source terminal connected to ground and the drain terminal connected to wire CKR, whereupon the delayed clock signal is rendered available. Two p-channel MOSFETs M30 and M31 have the drain terminals connected together and to wire CKR, the source terminals connected to supply source Vcc and gate terminals respectively to wires C and CN.

In the precharge phase, the node connected to wire CKR is discharged to the ground potential by MOSFET M32, since the gate is connected to wire CKN; in the amplification phase the potential on wire CKR varies only when one of the two MOSFETs M30, M31 begins to conduct, i.e. when the potential on C or on CN passes from Vcc to the ground potential. The desired delay is thus obtained.

We claim:

1. A C-MOS differential sense amplifier for detecting voltage differences between the signals applied to its inputs (I,IN) in correspondence with a level transition of a clock signal (CKD), comprising:
    a level converter (LS) which receives at respective input terminals (I,IN) forming said inputs signals to be sensed for lowering a common mode voltage of said signals without attenuating voltage difference thereof, under control of clock signals (CKD, CKN);
    a sense circuit (DD), which receives at respective first (C) and second (CN) input terminals, signals supplied by said level converter (LS) and which transfers to a first (O) and to a second (ON) output a voltage difference present at the first and second input terminals enormously amplified by a high positive feedback under the control of clock signals (CKD, CKR); and
    a feedback block (FB) which receives at input terminals thereof the signals at the first and second outputs (O,ON) of said sense circuit (DD) and generates a feedback signal (RE) said level converter, said sense circuit and said feedback block being configured so that in a first inactive phase of a clock signal (CKD), the level converter (LS), the sense circuit (DD) and the feedback block (FB) are inactive and in a second active phase of a clock signal (CKD), immediately after a clock signal transition the differential sense amplifier reaches an operating point necessary to render the level converter (LS) and the sense circuit (DD) active to start the high positive feedback which switches the sense circuit (DD) and, finally, after the level transition of a delayed clock signal (CKR), the feedback signal (RE) generated by the feedback block (FB) reduces to zero a dissipation of the whole differential sense amplifier.

2. The C-MOS differential sense amplifier as in claim 1 wherrein said level converter (LS) has its input terminals (I,IN) connected to the gate terminals of a first and a second n-channel MOSFETs, which have the source terminals connected together and to the drain of a third n-channel MOSFET, whose source is grounded and whose gate is connected to a first wire (CKD), which can be contacted from the outside, a fourth and a fifth p-channel MOSFETs having the source terminals connected to a supply source, the drain terminals connected to the respective drain terminals of said first and second MOSFETs, which can be contacted from the outside (C,CN) and the gate terminals connected together and to an output of said feedback block (FB), which is also connected to the drain of a sixth n-channel MOSFET, whose gate can be contacted from the outside through a second wire (CKN) and whose source is grounded.

3. The C-MOS differential sense amplifier as in claim 2 wherein in the level converter (LS) further p-channel diode-connected MOSFETs are placed in series with the drains of said fourth and fifth p-channel MOSFETs.

4. The C-MOS differential sense amplifier as in claim 1 wherein said feedback block (FB) consists of p-channel MOSFETs, whose drain terminals are connected together and to an output of the feedback block and one of said MOSFETs has a source connected to said first output and a gate connected to said second output, while the other of said MOSFETs has a source connected to said second output and a gate connected to said first output.

5. The C-MOS differential sense amplifier as in claim 1 wherein said level converter (LS) has its input terminals (I,IN) connected to gate terminals of a first and a second n-channel MOSFETs which have source terminals connected to each other and to a drain of a third n-channel MOSFET, whose source is grounded and whose gate is connected to a first wire which can be contacted from the outside, p-channel MOSFETs having source terminals connected to a supply source, drain terminals connected to the respective drain terminals of said first and second MOSFETs which can be contacted from the outside and gate terminals connected to each other and to the outside through the first wire.

6. The C-MOS differential sense amplifier as in claim 1 wherein said feedback block (FB) consists of n-channel MOSFETs, one of said MOSFETs having a source connected to said first input terminal (C), a drain connected to said first output (O) and a gate connected to said second output (ON), the other of said MOSFETs having a source connected to said second input terminal (CN), a drain connected to said second output (ON) and a gate connected to said first output (O).

7. The C-MOS differential sense amplifier as in claim 1 wherein said sense circuit (DD) comprises a p-channel MOSFET, which has a drain and a source connected to the first and second outputs and a gate connected to a wire to be contacted from the outside.

8. The C-MOS differential sense amplifier as in claim 1 wherein the clock signal is present on a first wire, an inverted clock signal is present on a second wire, and a delayed clock signal is present on a third wire.

9. The C-MOS differential sense amplifier as in claim 8 wherein said delayed clock signal is obtained from said clock signal by a delay circuit composed of an n-channel MOSFET which has a source connected to ground, a drain connected to said third wire and a gate connected to said second wire, and p-channel MOSFETs having drain terminals connected to each other and to the third wire, source terminals connected to a supply source and gate terminals connected to said first and second input terminals (C,CN).

* * * * *